United States Patent [19]

Bright

[11] Patent Number: 5,833,472
[45] Date of Patent: Nov. 10, 1998

[54] SOCKET ASSEMBLY FOR AN ELECTRONIC PACKAGE

[75] Inventor: Edward John Bright, Middletown, Pa.

[73] Assignee: The Whitaker Corporation, Wilmington, Del.

[21] Appl. No.: 508,570

[22] Filed: Jul. 27, 1995

[51] Int. Cl.⁶ .................................................. H01R 9/09
[52] U.S. Cl. .......................... 439/70; 439/526; 439/680
[58] Field of Search ................... 439/66, 71, 70, 439/68, 526, 266, 680, 607

[56] References Cited

U.S. PATENT DOCUMENTS

| | | | |
|---|---|---|---|
| 4,063,791 | 12/1977 | Cutchaw | 439/71 |
| 4,422,703 | 12/1983 | Christensen et al. | 439/266 |
| 4,461,524 | 7/1984 | McGhee | 439/71 |
| 4,597,617 | 7/1986 | Enochs | 439/66 |
| 4,832,612 | 5/1989 | Grabbe et al. | 439/71 |
| 5,123,850 | 6/1992 | Elder et al. | 439/68 |
| 5,241,453 | 8/1993 | Bright et al. | 439/607 |
| 5,355,283 | 10/1994 | Marr et al. | 361/760 |
| 5,357,672 | 10/1994 | Newman | 29/830 |
| 5,376,010 | 12/1994 | Petersen | 439/71 |
| 5,400,220 | 3/1995 | Swamy | 361/760 |
| 5,400,904 | 3/1995 | Maston, III et al. | 206/329 |
| 5,419,710 | 5/1995 | Pfaff | 439/266 |
| 5,473,510 | 12/1995 | Dozier, II | 439/66 |

*Primary Examiner*—Paula Bradley
*Assistant Examiner*—Tho D. Ta
*Attorney, Agent, or Firm*—Robert Kapalka

[57] ABSTRACT

A socket assembly (10) for an electronic package (2) comprises a base (20) which is mountable on a circuit board (8), and a separable subassembly (11) which houses the electronic package and is securable to the base with threaded fasteners (80). The subassembly (11) comprises an electronic package holder (30) mountable on the base (20), a heat sink (50) mountable on the holder, and polarizing pins (14) which are interference fitted between the holder and the heat sink. The holder has a topside (32), an underside (34) and a generally central opening (36) extending therebetween. The opening (36) is dimensioned to accommodate the package (2) and is formed with a seat (38) for the package such that leads (5) of the package will extend below the underside (34) for electrical connection with contacts in the base (20) when the package is supported on the seat. In a preferred embodiment, a shoulder member (40) which is configured as a frame resides in the opening of the holder and seats on a perimeter of the package.

16 Claims, 7 Drawing Sheets

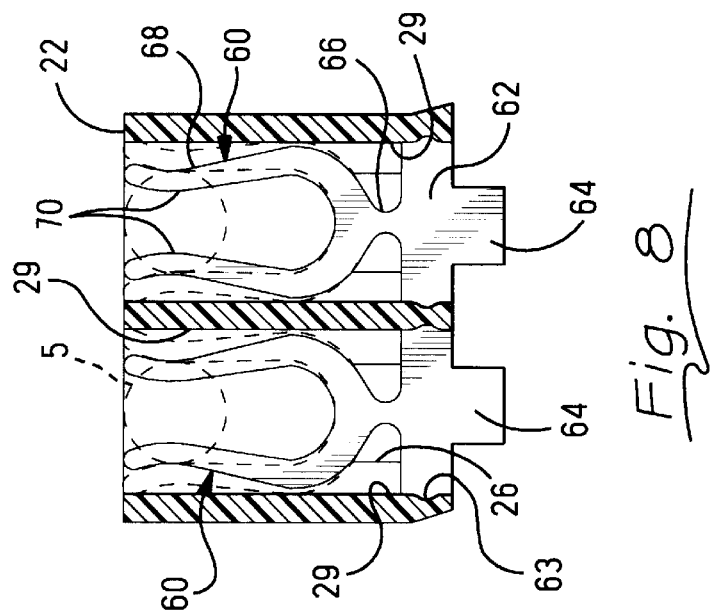
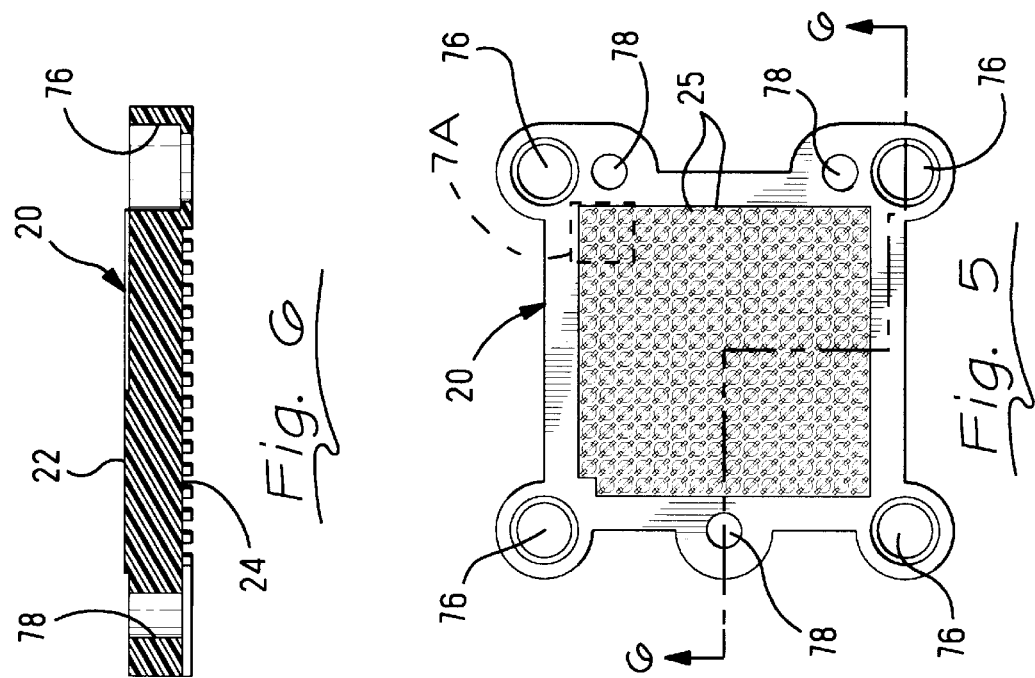

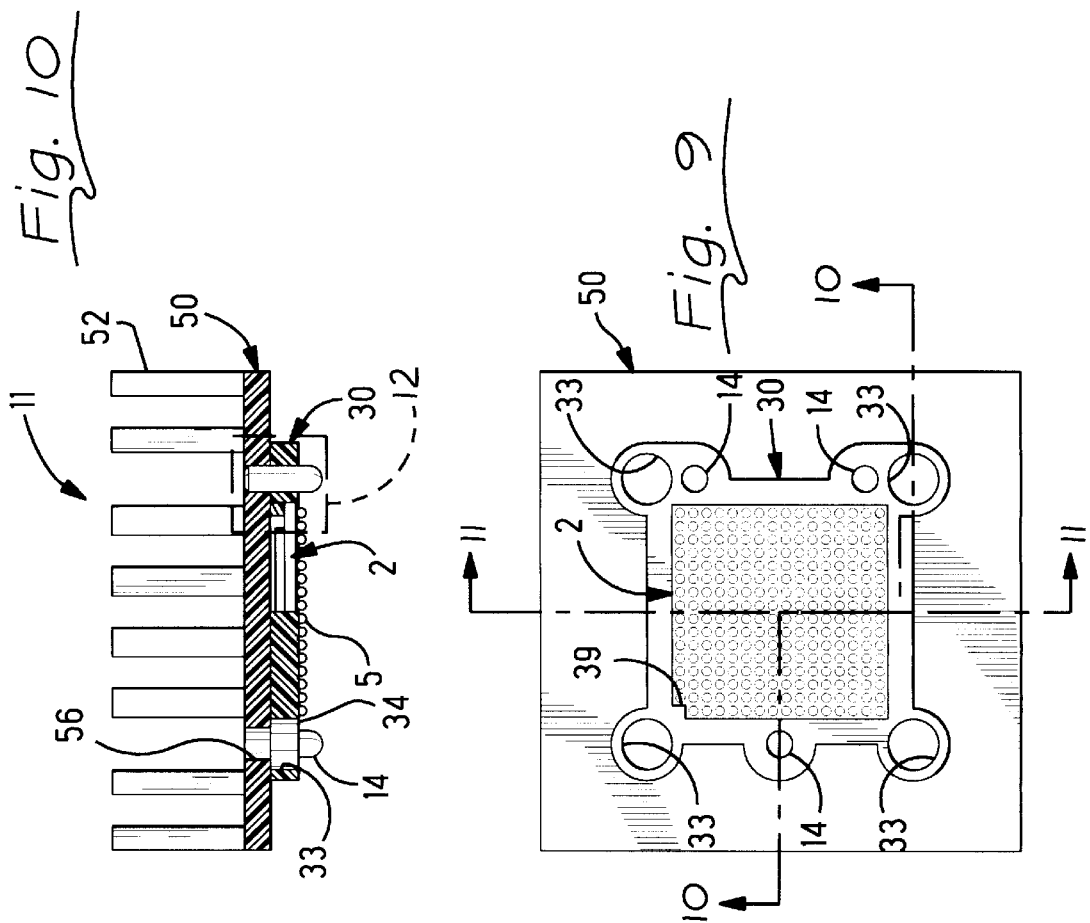

SOCKET ASSEMBLY FOR AN ELECTRONIC PACKAGE

FIELD OF THE INVENTION

The invention relates to an electrical socket for removably mounting an electronic package, and particularly a ball grid array package, on a circuit board or other substrate.

BACKGROUND OF THE INVENTION

Ball grid array (BGA) electronic packages are a relatively recent development in the packaging of integrated circuit (IC) chips. A BGA package comprises an IC chip which is encapsulated in a protective material and mounted on a substantially flat plastic or ceramic substrate. The chip is connected to leads in the form of metallic balls which are arranged in a grid on one face of the substrate. Typically, the BGA package is mounted directly on a circuit board using surface mount techniques to bond the balls to a corresponding array of pad structures on the board. For example, the balls themselves may be made from a solder alloy, or a solder paste may be deposited on the pads. The solder is then reflowed in a heating process, and the balls become bonded to their pads upon solder cooling.

Surface mounting is essentially a permanent mating which does not permit ready removal of an electronic package from the board. It is often desirable to mount an electronic package in a removable fashion to permit replacement of the package in case of a defect or a desire to upgrade the package. Sockets are well-known for removably mounting many different styles of electronic packages, but heretofore there has not been a practical socket for removably mounting a BGA electronic package.

In order to ensure reliable electrical connections between the balls of a BGA package and their associated pads in the absence of solder bonding, the balls must be loaded against their pads by a compressive force directed along an axis normal to the plane of the circuit board. Typically, an interposer having spring contacts would be placed between the BGA package and the circuit board. By clamping the package to the board with some force, the spring contacts in the interposer would electrically connect the balls of the package to the pads of the board. Due to coplanarity tolerances between the plane of balls and the plane of pads, a significant force must be applied to the package in order to ensure that a required minimum force is applied to each of the balls. Further, as the number of balls in the array increases, the total force which must be applied is increased. Since circuit boards are not normally constructed to withstand high clamping loads, a bolster board has been used as a backup beneath the circuit board to permit the application of a clamping load such as with bolts which engage in the bolster board. The bolster board takes up valuable space and increases the cost and complexity of assembly. Further, it is undesirable to apply a high compressive load to a plastic BGA package, since this may crack the housing.

There is a need for a socket which can accommodate a BGA package and provide reliable electrical interconnections with the balls of the package without application of a high normal force on the circuit board.

SUMMARY OF THE INVENTION

The invention is a socket assembly for interconnecting an electronic package having an array of leads depending from a bottom surface thereof to a circuit board. The socket assembly comprises a base which is mountable on the circuit board, a subassembly which houses the electronic package and is mountable on the base, and a means for securing the subassembly to the base. The base has a top surface, a bottom surface, and an array of contacts disposed in cavities in the base and corresponding to the array of leads. Each of the contacts has a respective lead section extending below the bottom surface for electrical connection with a corresponding circuit path on the circuit board. The subassembly comprises an electronic package holder mountable on the base, a heat sink mountable on the holder, and a means for fastening the heat sink to the holder. The holder has a topside and an underside and a generally central opening extending therebetween. The opening is dimensioned to accommodate the package and is formed with a seat for the package such that the leads of the package will extend below the underside for electrical connection with the contacts in the base when the package is supported on the seat.

In a preferred embodiment, a shoulder member having a central opening is provided. The shoulder member is dimensioned to reside in the opening of the holder and to seat on a perimeter of the package. A thermally conductive material may be disposed in the opening of the shoulder member for thermal communication between the package and the heat sink.

BRIEF DESCRIPTION OF THE DRAWINGS

The invention will now be described by way of example with reference to the accompanying drawings in which like elements in different figures thereof are identified by the same reference numeral and wherein:

FIG. 5 is a top plan view of a base of the socket assembly.

FIG. 6 is a cross-sectional view taken along line 6—6 of FIG. 5.

FIG. 8 is a cross-sectional view taken along line 8—8 of FIG. 7A.

FIG. 9 is bottom plan view of a socket subassembly according to the invention.

FIG. 10 is a cross-sectional view taken along line 10—10 of FIG. 9 and rotated 180° clockwise.

FIG. 11 is a cross-sectional view taken along line 11—11 of FIG. 9 and rotated 90° clockwise.

FIG. 12 is an enlarged portion (detail 12) of the subassembly of FIG. 10.

DETAILED DESCRIPTION OF THE PREFERRED EMBODIMENT

Figure 1:
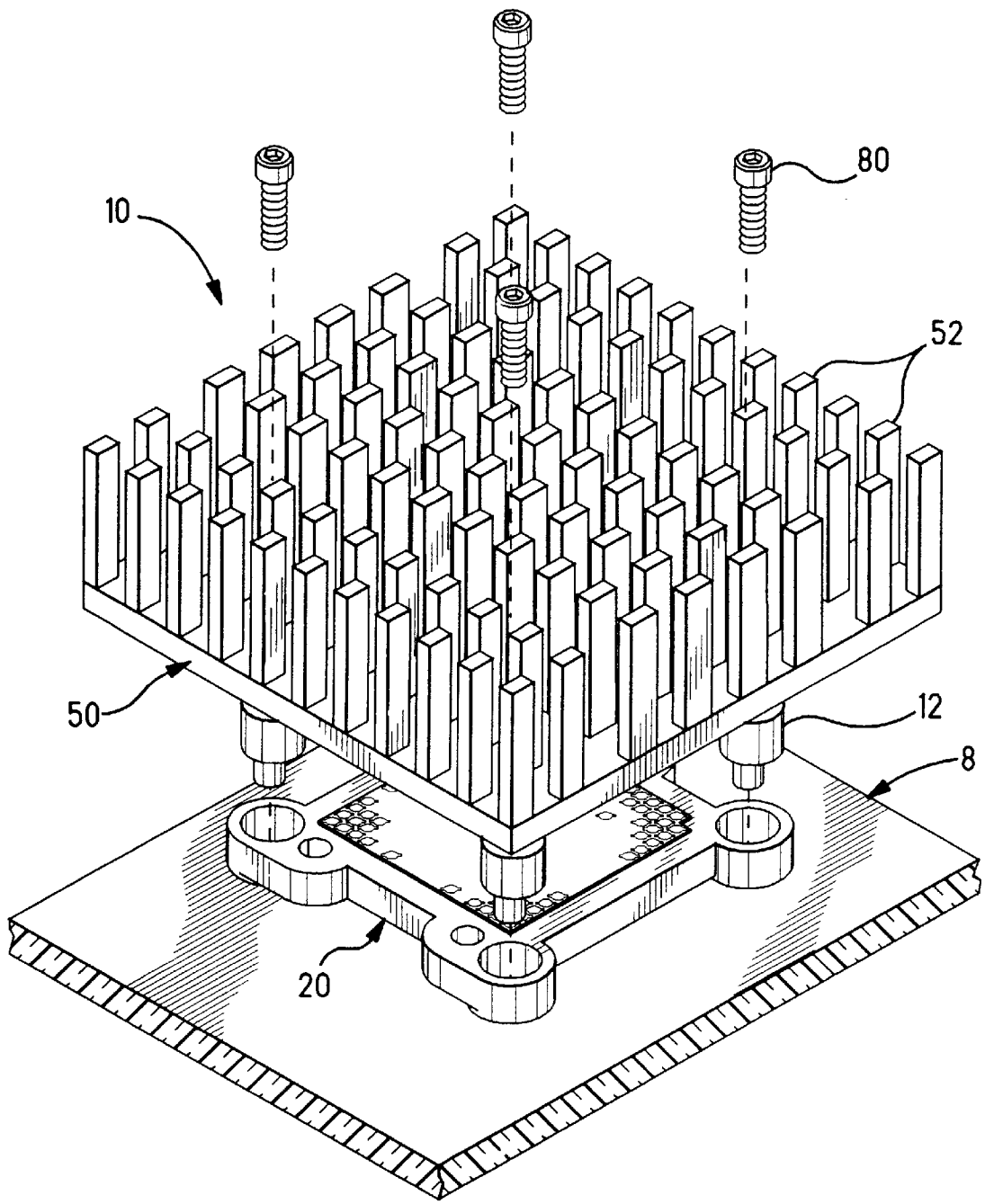
FIG. 1 is a top isometric view of a socket assembly according to the invention.
Figure 2:
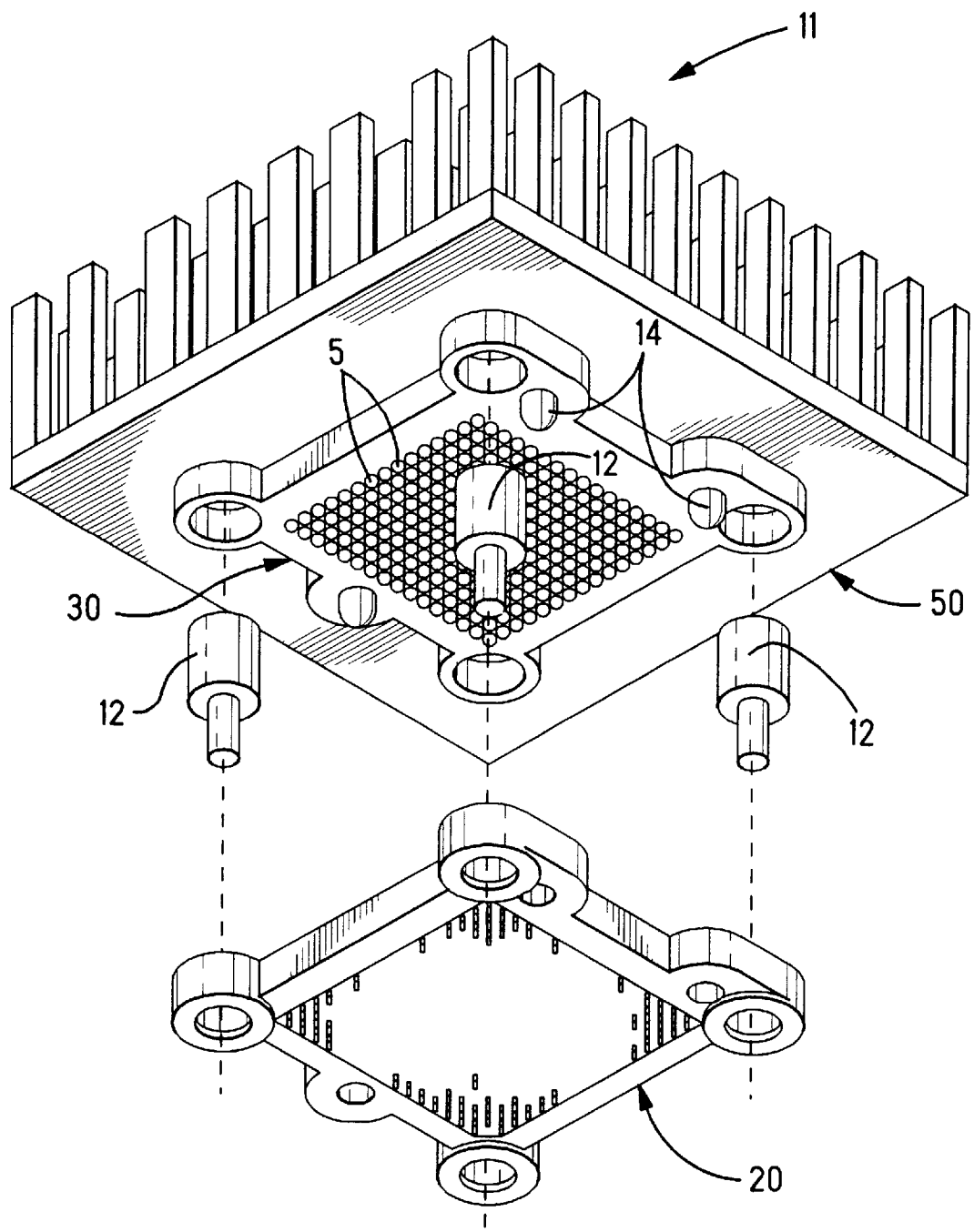
FIG. 2 is a bottom isometric view of the socket assembly.
Figure 3:
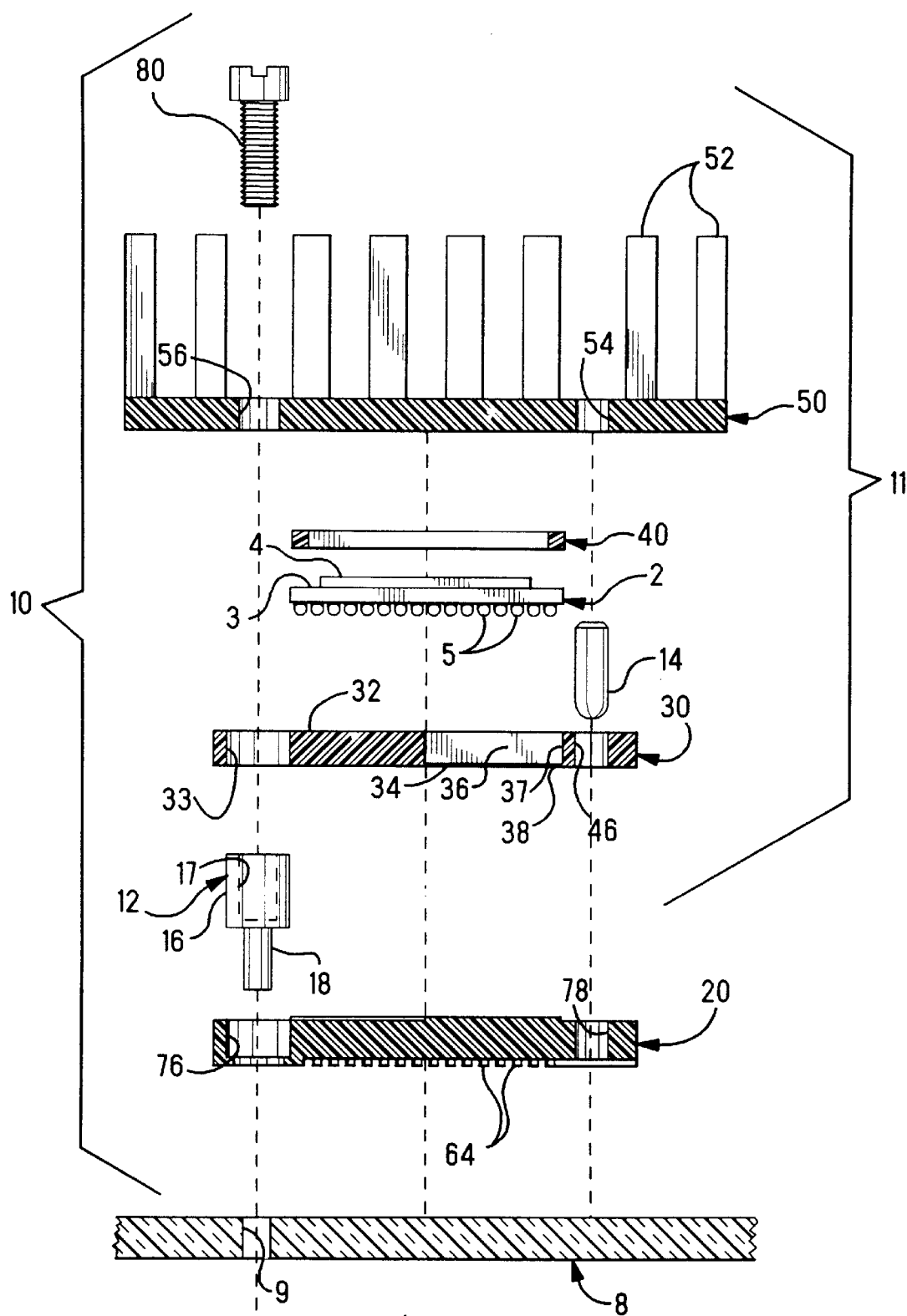
FIG. 3 is an exploded cross-sectional side elevation view of the socket assembly.
Figure 4:
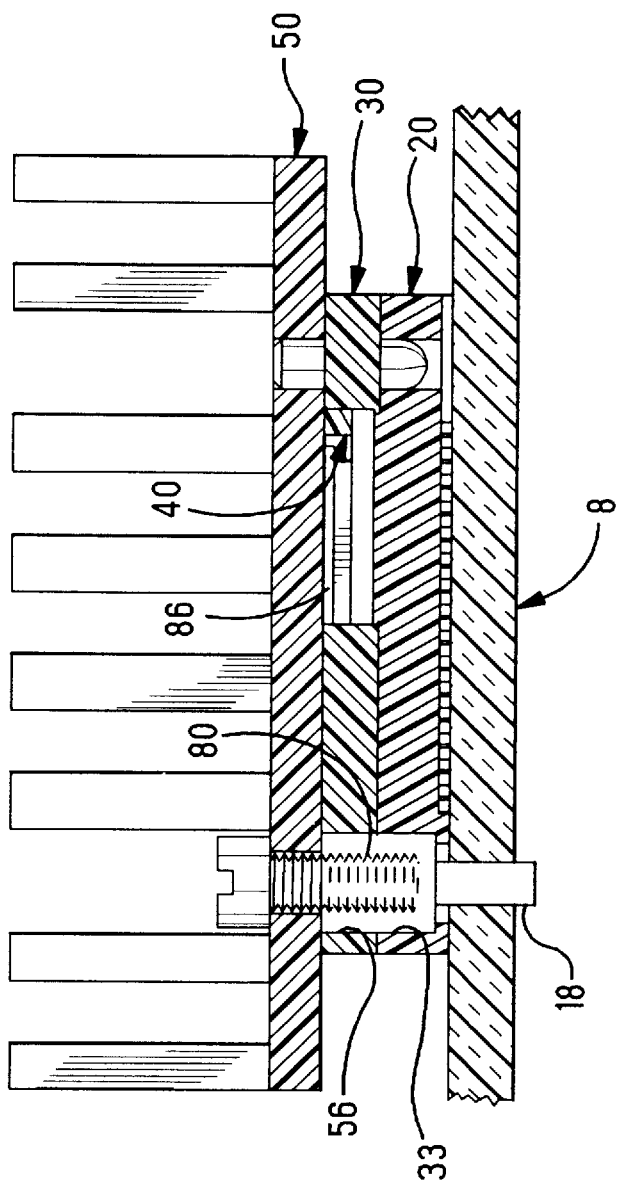
FIG. 4 is a cross-sectional side elevation view of the socket assembly mounted on a circuit board.

With reference to FIGS. 1–4, a socket assembly 10 according to the invention is suitable for removably mounting an integrated circuit chip carrier such as a ball grid array (BGA) electronic package 2 on a circuit board 8. The BGA package 2 comprises a substantially flat plastic or ceramic substrate 3 on which is mounted an integrated circuit chip 4, and which has a plurality of metallic balls 5 serving as external electrical leads for the chip 4. The balls 5 are arranged according to industry accepted standards in a predetermined grid array over a face of the substrate 3.

The socket assembly 10 includes a socket body or base 20, a package holder 30, and a heat sink 50. The base 20 and the holder 30 are each molded from a dielectric material such as a liquid crystal polymer, while the heat sink 50 is generally made of aluminum. A heat sink shoulder member 40 may also be provided to direct compressive loads to a perimeter of the package 2 as will be discussed hereinbelow. The heat sink 50 is formed with columns or fins 52 which provide a large surface area for enhancing heat transfer from the package 2 to ambient air.

The holder 30 has a topside 32, an underside 34, and a generally central opening 36 which extends through the holder from the topside 32 to the underside 34. The opening 36 has a peripheral wall 37 which is dimensioned to closely encompass the package 2 which is insertable into the opening through the topside 32. A lip 38, as best seen in FIG. 12, prevents egress of the package through the underside 34. Pins 14 are carried by the holder 30 such as by an interference fit in apertures 46. Alternatively, the pins 14 may be molded integrally with the holder 30. A means for fastening the heat sink 50 to the holder 30 is provided by an interference fit of the pins 14 in apertures 54 of the heat sink. A subassembly 11 comprising the holder 30 and the heat sink 50 serves as a protective holder and transport device for the package 2 prior to mounting of the subassembly 11 on the base 20.

Figure 7A:
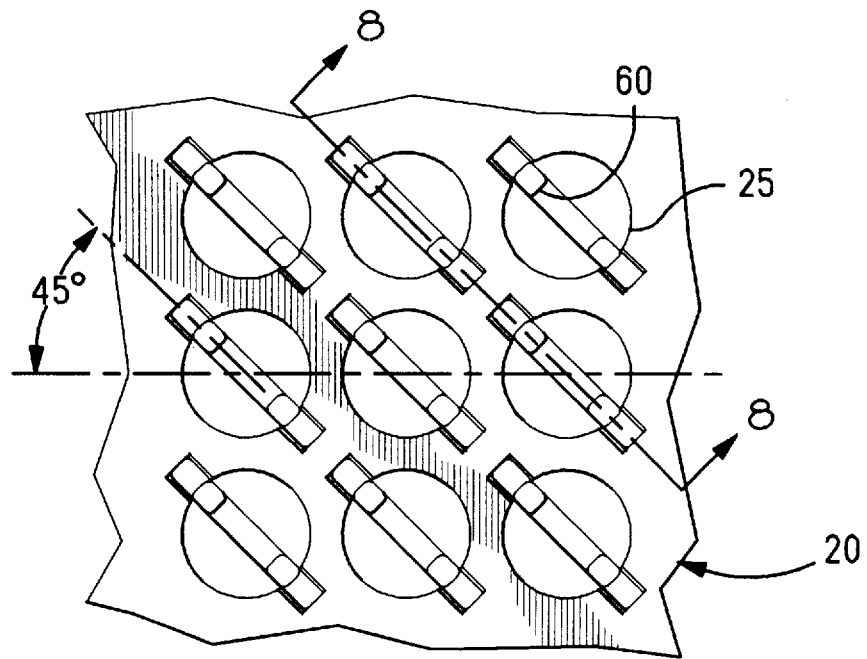
FIGS. 7 and 7A are enlargements of a portion (detail 7A, FIG. 5) of the base, showing cavities without contacts and with contacts, respectively.
Figure 7:
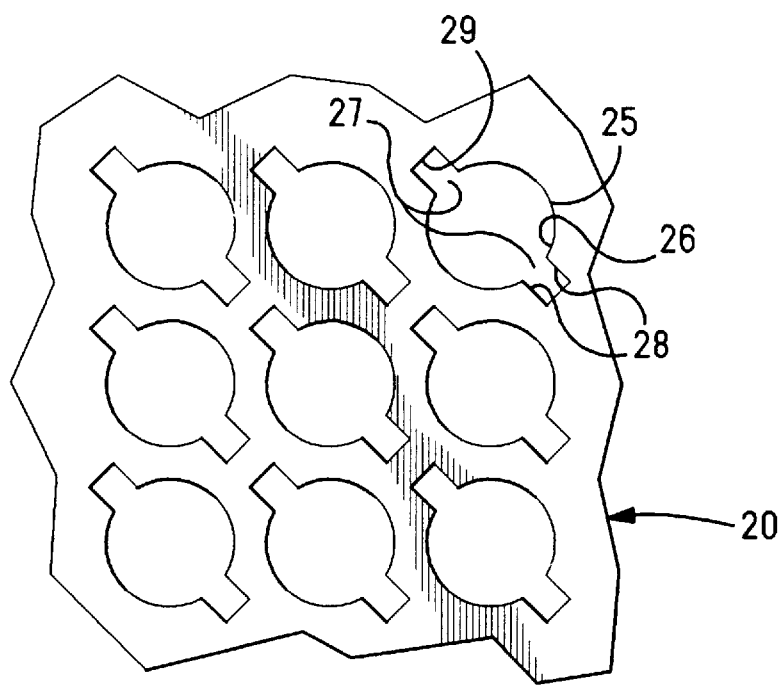

As shown in FIGS. 5 and 6, the base 20 has a top surface 22, a bottom surface 24, and an array of contact receiving cavities 25 corresponding to the array of balls 5 of the package 2. As shown in detail in FIGS. 7 and 7A, each of the cavities 25 has a substantially cylindrical wall 26 which is interrupted by a pair of diametrically opposed slots 27 which extend axially along the length of the wall 26. The cavities 25 are aligned in rows and columns which appear horizontal and vertical, respectively, when viewed in the plan view of FIG. 5, and the pairs of slots 27 are aligned linearly in planes which are offset at an angle of approximately 45° to the rows of the cavities. Contacts 60 are disposed in the cavities 25 and are aligned in the slots 27 between side walls 28 and end walls 29. Thus, the contacts 60 are offset at the same approximately 45° angle with respect to the rows of cavities, thereby permitting a dense arrangement of the contacts in the base 20.

Referring now to FIG. 8, each of the contacts 60 has a retention section 62 with barbed ends 63 which grip the end walls 29 to retain the contact in the cavity. Below the retention section 62 is a lead section 64 which is configured to be surface mount soldered to a respective contact pad on the circuit board. Above the retention section 62 is a compliant section 66 joined to a contact section 68 which includes a pair of opposed spring contact arms 70. The balls 5 of the package 2 are received between respective pairs of the contact arms 70 when the package 2 is mounted in the socket. The contact arms 70, which are free to flex resiliently in the plane of their respective pair of slots 27, exert a compression force on each of the balls 5 due to spring deflection of the arms, which are shown in deflected position by phantom lines in FIG. 8. The compression force on each of the balls is exerted in a plane which is substantially parallel to the top surface 22 of the base. In this way, the contacts 60 exert their own spring forces on the balls 5 so as to maintain good electrical connections therebetween without reliance on any other device for pressing the balls into engagement with the contacts.

Referring back to FIGS. 3–6, four through-holes 76 in the base 20, one at each corner, are dimensioned for an interference fit with respective inserts 12. Each of the inserts 12 has a retention section 16 which is receivable in a respective hole 33 in the holder 30 with a slip fit. The retention section 16 has an internally threaded bore 17 which is threadedly engageable by a respective threaded fastener 80 which is insertable through a clearance hole 56 in the heat sink 50. The inserts 12 and the fasteners 80 provide a means for securing the subassembly 11 to the base 20. Each of the inserts 12 has a peg portion 18 which may be through-hole soldered in a respective hole 9 in the circuit board, or may be surface mount soldered to the board. Alternatively, the peg portion 18 could be threaded and fastened to the board by a complementary threaded fastener below the board, with a dielectric material washer between the fastener and the board.

The base 20 also has three holes 78 which are dimensioned for a close slip fit with the pins 14 which are carried by the holder 30. The three holes 78 are disposed apart at apices of a non-equilateral triangle, whereby the pins 14 serve as polarizing pins for the subassembly 11. With reference to FIG. 9, the package 2 is polarized in the holder 30 such as by a projection 39 of the holder which is received in a corresponding recess of the package.

The package 2 is positioned vertically in the holder 30 so that the balls 5 will be disposed at a desired dimension below the surface 34 for engagement and capture between the pairs of contact arms 70. As shown in FIGS. 10 and 12, a small lip 38 extends into the opening 36 from the wall 37 near the underside 34. The lip 38 serves as a seat for a perimeter area of the substrate 3 outward of the balls 5, and thereby prevents egress of the package 2 out of the opening through the underside 34.

The heat sink shoulder member 40 is configured as a frame which is sized to fit in the opening 36 and to seat on a perimeter of top face 6 of the substrate 3. The shoulder member 40 cooperates with the lip 38 to locate and confine the package 2 in the opening 36. The shoulder member 40 has a central opening in which the chip 4 resides, and the shoulder member 40 is sufficiently high to prevent crushing of the chip 4 by the heat sink 50. When the socket assembly is secured together by threaded engagement of the screw fasteners 80 in the inserts 12, the shoulder member 40 serves to transmit tightening loads to the outer edge of the substrate 3, and thereby protects the chip 4 from damage. The shoulder member 40 may be either a separate piece or may be integrally formed with the heat sink 50.

Lower ends of the pins 14 are dimensioned to extend further below the underside 34 of the holder than the balls 5 when the package 2 is secured in the holder, whereby the pins 14 serve to protect the balls 5 from damage such as could occur by dropping the subassembly or placing the subassembly down carelessly on a hard surface.

To provide for heat transfer from the chip 4, a layer of heat transfer material 86 is preferably provided between the heat sink 50 and the chip 4, as shown in FIG. 11. The material 86 is preferably a compressive foam-like material which deforms as the fasteners 80 are tightened to prevent crushing of the chip 4, and which exhibits good thermal conductivity after deformation to provide for heat transfer from the package 2.

A socket assembly according to the invention has several advantages. A ball grid array electronic package may be removably mounted on a circuit board. Contacts in the socket exert compressive forces on each ball of the package in a direction which is parallel to the plane of the package, thereby minimizing forces on the body of the package. The socket assembly includes a subassembly which functions as a holder and protective receptacle for the electronic package during transport and handling.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

I claim:

1. A socket assembly for interconnecting an electronic package having an array of leads depending from a bottom surface thereof to a circuit board, comprising:

a base having a top surface, a bottom surface, and an array of contacts disposed in cavities in the base and corresponding to the array of leads, each of the contacts having a respective lead section extending below the bottom surface for electrical connection with the circuit board, the cavities being opened through the top surface;

a subassembly which is mountable on the base, the subassembly including:

a holder having a topside and an underside and a generally central opening extending therebetween, the opening being dimensioned to accommodate the package and being formed with a seat for the package such that the leads will extend below the underside for electrical connection with the contacts when the package is supported on the seat;

a heat sink mountable on the topside in thermal communication with the package; and, means for fastening the heat sink to the holder, whereby the subassembly is an individually transportable receptacle for the package prior to being mounted on the base; and, means for securing the subassembly to the base.

2. The socket assembly according to claim 1, wherein the means for securing includes threaded fasteners.

3. The socket assembly according to claim 2, wherein the means for securing further includes inserts each of which is secured to the base and is threadedly engageable by a respective one of the threaded fasteners.

4. The socket assembly according to claim 3, wherein the inserts are interference fitted in respective holes in the base.

5. The socket assembly according to claim 1, wherein the means for fastening comprises pins which are interference fitted in respective apertures.

6. The socket assembly according to claim 5, wherein the pins are carried by the holder and extend further below the underside of the holder than the leads when the package is supported on the seat, whereby the pins protect the leads from damage.

7. The socket assembly according to claim 1, further comprising a shoulder member having a central opening and dimensioned to reside in the opening of the holder and to seat on a perimeter of the package.

8. The socket assembly according to claim 7, further comprising a thermally conductive material dimensioned to reside in the opening of the shoulder member for thermal communication between the package and the heat sink.

9. The socket assembly according to claim 1, further comprising polarizing pins carried by the holder and receivable in respective holes in the base.

10. The socket assembly according to claim 9, wherein the polarizing pins extend further below the underside of the holder than the leads when the package is supported on the seat, whereby the polarizing pins protect the leads from damage.

11. The socket assembly according to claim 9, wherein the polarizing pins are interference fitted in respective apertures in the heat sink.

12. A socket subassembly for use with an electronic package having an array of leads depending from a bottom surface thereof, the socket subassembly being mountable on a socket base having a plurality of contacts disposed in an array corresponding to the array of leads, the subassembly comprising:

a holder having a topside and an underside and a generally central opening extending therebetween, the opening being dimensioned to accommodate the package and being formed with a seat for the package such that the leads will extend below the underside for electrical connection with the contacts when the package is engaged with the seat;

a heat sink which is mountable on the topside in thermal communication with the package; and, means for fastening the heat sink to the holder, whereby the subassembly is an individually transportable receptacle for the package prior to being mounted on the base.

13. The socket subassembly according to claim 12, further comprising a shoulder member dimensioned to reside in the opening of the holder and to seat on a perimeter of the package.

14. The socket subassembly according to claim 12, wherein the means for fastening comprises pins which are carried by the holder and interference fitted in respective apertures in the heat sink.

15. The socket subassembly according to claim 12, wherein the pins are polarizing pins which extend below the underside of the holder for insertion in respective holes in a base.

16. The socket subassembly according to claim 15, wherein the polarizing pins extend further below the underside of the holder than the leads when the package is supported on the seat, whereby the polarizing pins protect the leads from damage.

* * * * *